United States Patent
Ernst et al.

(10) Patent No.: US 7,062,690 B2
(45) Date of Patent: Jun. 13, 2006

(54) SYSTEM FOR TESTING FAST SYNCHRONOUS DIGITAL CIRCUITS, PARTICULARLY SEMICONDUCTOR MEMORY CHIPS

(75) Inventors: Wolfgang Ernst, München (DE); Gunnar Krause, München (DE); Justus Kuhn, München (DE); Jens Lüpke, München (DE); Jochen Müller, München (DE); Peter Pöchmüller, München (DE); Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 524 days.

(21) Appl. No.: 09/907,786

(22) Filed: Jul. 18, 2001

(65) Prior Publication Data
US 2002/0070748 A1    Jun. 13, 2002

(30) Foreign Application Priority Data
Jul. 18, 2000   (DE) ............................... 100 34 900

(51) Int. Cl.
*G01R 31/28* (2006.01)
(52) U.S. Cl. .................................... 714/724
(58) Field of Classification Search ............... 714/718, 714/719, 724, 738, 742, 30, 31, 42, 734; 365/201
See application file for complete search history.

(56) References Cited

U.S. PATENT DOCUMENTS

| 5,640,509 | A | | 6/1997 | Balmer et al. |
| 5,995,424 | A | * | 11/1999 | Lawrence et al. ........... 365/201 |
| 6,249,893 | B1 | * | 6/2001 | Rajsuman et al. ........... 714/741 |
| 6,587,979 | B1 | * | 7/2003 | Kraus et al. ................. 714/720 |
| 6,642,736 | B1 | * | 11/2003 | Mori et al. .................. 324/765 |
| 6,690,189 | B1 | * | 2/2004 | Mori et al. .................. 324/765 |
| 2003/0233606 | A1 | * | 12/2003 | Mabuchi ..................... 714/724 |

FOREIGN PATENT DOCUMENTS

DE                19928981 A1    1/2000

* cited by examiner

*Primary Examiner*—Albert Decady
*Assistant Examiner*—John J. Tabone, Jr.
(74) *Attorney, Agent, or Firm*—Laurence A. Greenberg; Werner H. Stemer; Ralph E. Locher

(57) ABSTRACT

A system and a method for testing fast synchronous digital circuit with an additional built outside self test semiconductor chip disposed between a test device and circuit under test. The chip has a switching/detection unit that tests the chip based on external criteria between a first normal operating mode in which the chip tests the circuit to be tested, and a second operating mode in which programmable registers of the register unit of a receiver of the chip are programmed by the external test device. The registers store constants and variables for generating the test signals and for evaluating them. The chip generates test signals and transceiver for sending the test signals and receiving response signals generated thereby.

16 Claims, 2 Drawing Sheets

SYSTEM FOR TESTING FAST SYNCHRONOUS DIGITAL CIRCUITS, PARTICULARLY SEMICONDUCTOR MEMORY CHIPS

BACKGROUND OF THE INVENTION

Field of the Invention

The invention lies in the field of integrated circuits.

The invention relates to a system for testing fast synchronous digital circuits, particularly, semiconductor memory chips, in which test signals such as test data, control, address, and clock signals are transmitted based on signal conditions input by a test device to a circuit to be tested (Device Under Test or DUT) and are evaluated by the DUT in dependence on response signals generated by the test signals supplied.

Today's Dynamic Random Access Memory (DRAM) chips are tested with costly production test devices. The test devices allow signals having precisely defined voltage levels to be applied to the memory chip or Device Under Test to be tested at precisely defined times. During a checking of the read function of the DUT, it is also possible to read signals coming from the DUT into the test device at precisely defined times and to compare them with expected signal values.

Due to the high frequencies of today's memory chips, e.g., 400 megahertz clock frequency in the case of RAM-BUS DRAMs, the specification of these chips requires a high timing accuracy of the signals (in the case of Double Data Rate (DDR) memories, signal specifications of the order of magnitude of 500 ps are already currently used). As such, production test devices used must in some cases meet the highest technical requirements, which leads to correspondingly high production and test costs. Current DRAM test devices cost several million dollars. Thus, the costs of testing super high frequency memory chips already amount to up to 30% of the total production costs.

Here, and in other parallel and related patent applications, the implementation of a so-called Build Outside Self-Test (BOST) chip is proposed. A very simple and inexpensive BOST chip can be implemented in the form of an ASIC circuit that is capable of testing a fast DRAM memory directly and inexpensively by various methods. Such a BOST chip can be mounted in the direct vicinity of the semiconductor chip to be tested, i.e., the DRAM memory, due to its small dimensions and cheap mass production. Because such a configuration makes it possible to increase the accuracy/frequency and due to the fact that the cost for such a BOST chip is only a fraction of a conventional test device if it is made in large numbers, a slower, and, therefore, more inexpensive test device hitherto used can continue to be used and the total costs of testing can be reduced.

The BOST chip, which can be implemented as ASIC circuit, takes over functions of the conventional memory test device, either partially or completely, and eliminates the existing restrictions of the prior art memory test devices by internal signal generation in the BOST chip such as, e.g., frequency multiplication. Because the BOST chip is intended to be capable of performing any desired algorithmic and logic operations, e.g., for generating a sequence of test addresses and test data, it is proposed to store corresponding constants and variables, such as, e.g., the start value and end value of an address sequence, in registers.

SUMMARY OF THE INVENTION

It is accordingly an object of the invention to provide a system for testing fast synchronous digital circuits, particularly, semiconductor memory chips that overcomes the hereinafore-mentioned disadvantages of the heretofore-known devices and methods of this general type and that provides a generic test system such that programmable storage registers provided in a BOST chip can be programmed from an external test device to carry out the test operation of the BOST chip safely and reliably based on the values programmed into the register by the test device and such that the register programming cycle can also run undisturbed by the test operation.

With the foregoing and other objects in view, there is provided, in accordance with the invention, a system for testing a fast synchronous digital circuit with an external test device outputting signal conditions on a signal path, including a semiconductor chip for transmitting test signals, including at least one of test data, control, address, and clock signals, to a circuit to be tested, the test system evaluating the response signals generated by the circuit to be tested based upon the test signals supplied, the semiconductor chip inserted into a signal path between a test device and the circuit to be tested. The semiconductor chip has means to be connected to the test device for receiving signal conditions input by the test device, the receiving means having a register unit with programmable registers for storing constants and variables for generating the test signals and for evaluating the constants and the variables, means for generating the test signals for the circuit to be tested, the generating means connected to the receiver, means for sending the test signals to the circuit to be tested and for receiving response signals generated by the circuit to be tested, the sending means connected to the generating means, means for switching the semiconductor chip between two operating modes as a function of switching criteria, the two operating modes including (1) a normal operating mode in which the semiconductor chip drives the circuit to be tested and (2) a register programming mode in which the registers of the register unit are programmed, and the switching means connected to the test device, to the receiving means, and to the generating means. Preferably, the system is used for testing a memory chip, particularly, a fast synchronous SDRAM memory chip and/or a fast synchronous SGRAM memory chip. The means for receiving can be a receiver. The means for generating can be a test signal generator. The means for sending can be an interface. The means for switching can be a switch.

To achieve its goals, a test system according to the invention is characterized by the fact that an additional semiconductor circuit (BOST chip), having a receiver/generator/transceiver device or means for receiving the signal conditions input by the test device, for generating the test signals, for sending them to the DUT and for receiving the response signals then generated by the DUT, is inserted into the signal path between the test device and the DUT. The device or means contains a register unit with programmable registers for storing constants and variables for generating the test signals and evaluating them. Also, the BOST chip also has a switch or means for switching the BOST chip between two operating modes:

(1) a normal operating mode in which the BOST chip drives the DUT; and (2) a BOST register programming mode in which the registers of the register unit are programmed.

In accordance with another feature of the invention, the external test device has a separate signal line for transmitting an external switching signal for switching between the two operating modes, and the switching means is to be connected to the separate signal line for being switched between the two operating modes.

In accordance with a further feature of the invention, the switching means has a detection means for detecting switching conditions for the two operating modes in dependence on a particular signal sequence in signals transmitted to the semiconductor chip by the test device, i.e., on the switching criteria.

An essential aspect of the invention thus arises in that, apart from the normal operating mode in which the BOST chip tests the semiconductor circuit to be tested, particularly, the semiconductor memory DUT, a further operating mode is provided in which the programmable registers of the BOST chip are programmed from the external test device and that the switching means of the BOST chip contain detection means to switch between these two operating modes by external stimuli. The switching can be done, for example, by an external separate control signal that is supplied from the control device to the BOST chip.

As an alternative, the signal channel necessary for such can be saved by the detector checking one or more signals, which must be supplied to the BOST chip from the test device in any case, for a certain signal sequence that then acts as stimulus for switching to the other operating mode in each case. For example, in the case of incomplete take-over of all functions of the test device by the BOST chip in the normal operating mode, one or more signals are still supplied by the test device to the BOST chip that it then forwards changed or unchanged to the semiconductor circuit DUT to be tested.

In accordance with an added feature of the invention, the switching means is programmed to interrupt and to stop the normal operating mode of the semiconductor chip during programming of the registers of the register unit.

In accordance with an additional feature of the invention, the switching means is programmed to switch the semiconductor chip into the programming mode only within certain periods when the semiconductor chip is not accessing any of the registers of the register unit for generating test signals.

In accordance with yet another feature of the invention, the test device calculates and stores periods intended for switching the switching means to the programming mode once externally.

In accordance with yet a further feature of the invention, the semiconductor chip has additional registers equal in number to the registers, and the semiconductor chip for generating test signals in the normal mode only accesses ones of the registers and the additional registers not currently programmed.

With the objects of the invention in view, there is also provided a method for testing fast synchronous digital circuits, including the steps of outputting signal conditions with an external test device to a semiconductor chip, receiving the signal conditions with the semiconductor chip from the test device, storing constants and variables for generating test signals in programmable registers of a register unit in the semiconductor chip and evaluating the constants and the variables with the registers of the register unit, generating test signals with the semiconductor chip and transmitting the test signals including at least one of test data, control, address, and clock signals, with the semiconductor chip to a circuit to be tested based on the signal conditions supplied by the test device, evaluating the response signals generated by the circuit to be tested based upon test signals supplied, receiving the response signals with the semiconductor chip, and switching, as a function of switching criteria, the semiconductor chip between a normal operating mode in which the semiconductor chip drives the circuit to be tested DUT, and a register programming mode in which the registers of the register unit are programmed.

In accordance with yet an added mode of the invention, an external switching signal is transmitted through a separate signal line of the test device to a switch of the semiconductor chip, and the normal operating mode and the register programming mode are switched based on the external switching signal.

In accordance with yet an additional mode of the invention, switching conditions for the normal operating mode and the register programming mode are detected in dependence on a particular signal sequence in signals transmitted to the semiconductor chip from the external test device.

In accordance with again another mode of the invention, the normal operating mode of the semiconductor chip is interrupted or stopped during programming of the registers of the register unit.

In accordance with again a further mode of the invention, the semiconductor chip is switched into the register programming mode only within certain periods during which the semiconductor chip is not accessing any of the programmable registers of the register unit and generating test signals.

In accordance with again an added mode of the invention, periods intended for switching to the programming mode once externally are calculated and stored with the test device.

In accordance with a concomitant mode of the invention, the registers of the register unit are duplicated and the semiconductor chip used for generating test signals in the normal operating mode only accesses currently not programmed registers.

Preferably, the circuits tested are semiconductor memory chips, particularly, fast synchronous SDRAM or SGRAM memory chips.

Other features that are considered as characteristic for the invention are set forth in the appended claims.

Although the invention is illustrated and described herein as embodied in a system for testing fast synchronous digital circuits, particularly, semiconductor memory chips, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
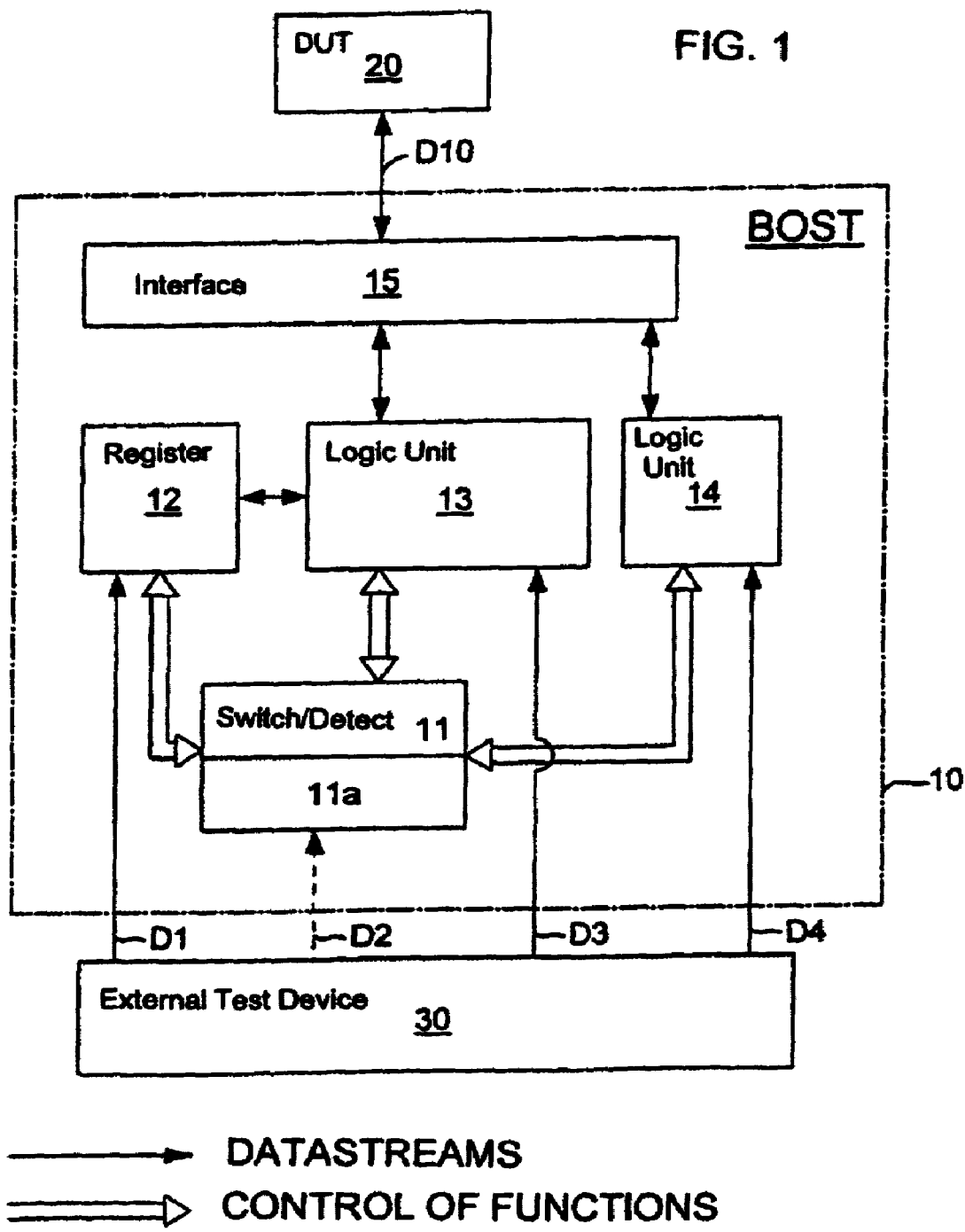
FIG. 1 of the drawings is a functional block circuit diagram of an exemplary embodiment of a BOST chip switching between the two operating modes according to the invention, and inserted between a device under test and an external test device.
Figure 2:
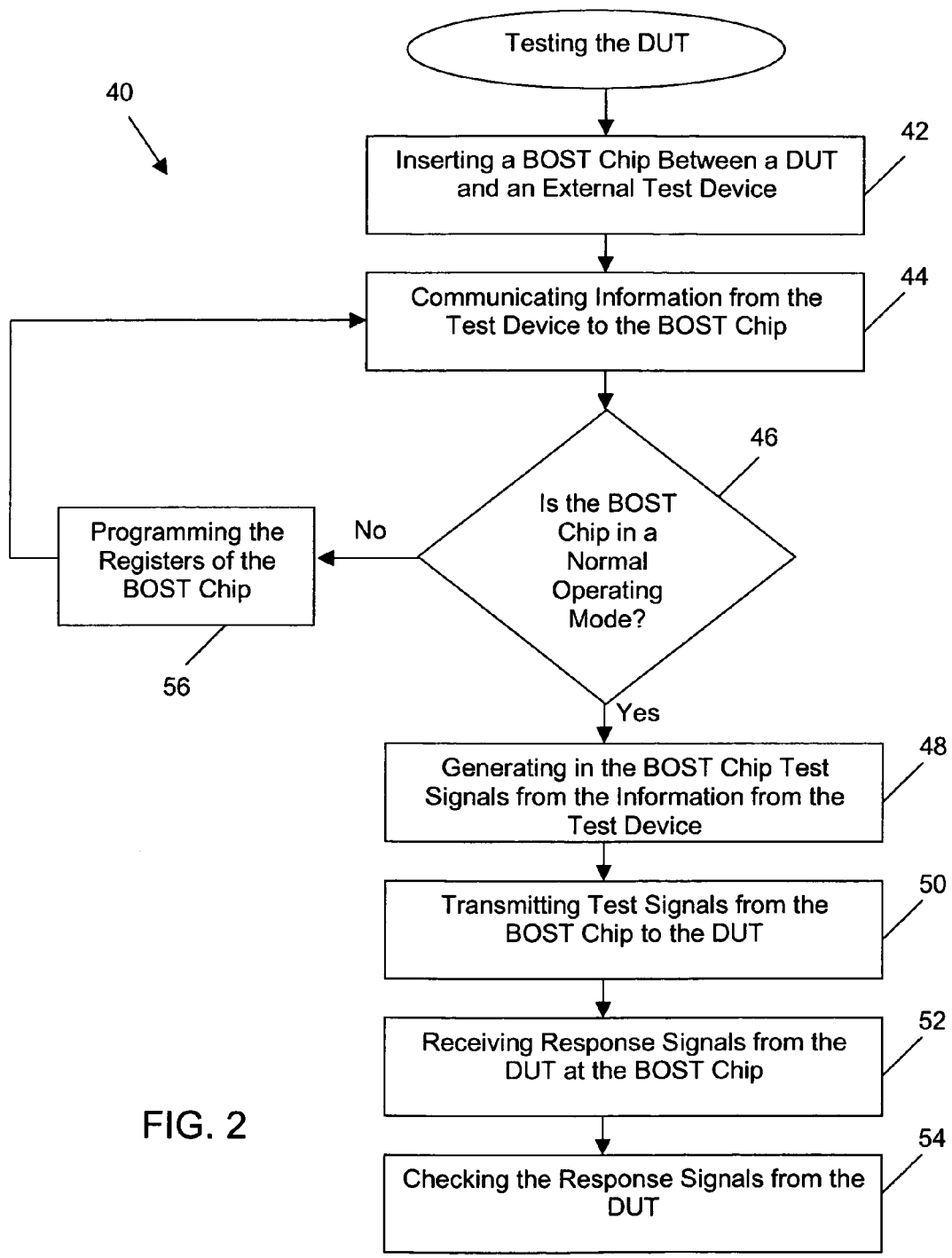
FIG. 2 is a flow diagram illustrating the operation of one particular embodiment of the system of the present invention.

Referring now to FIGS. 1 and 2, FIG. 1 shows a BOST chip inserted between a device under test and an external test device (step 42 of FIG. 2). FIG. 2 is a flow diagram 40 of one embodiment of the operation thereof. The BOST chip 10 contains a register unit 12 with registers that can be programmed by the external test device 30, an algorithmic/logic unit 13, a logic unit 14 that is not register-driven, an interface unit 15 that forms an interface to a line system D10 leading to the DUT 20 (which is preferably a semiconductor circuit, e.g., a DRAM memory), and a switching/detection unit 11/11a that has the function of operating the BOST chip 10 in two operating modes depending on switching criteria (step 46 of FIG. 2):

(1) a normal operating mode in which the BOST chip 10 drives the DUT 20 by the test signals generated and/or stored in the BOST chip through the interface unit 15 and line system D10; and (2) a BOST register programming mode in which the programmable registers of the register unit (12) are programmed. See, step 56.

A switching criteria for switching between these two operating modes can be supplied to the BOST chip, i.e., to the switching/detection unit 11/11a, by an external, separate control signal D2, drawn dashed in the figure, from the test device 30.

As an alternative, the external signal channel D2 can also be saved by one or more signals (which must be supplied to the BOST chip from the test device 30 in any case) being checked by the switching/detection unit 11/11a for a certain signal sequence that acts as the switch to the other respective operating mode for the switching unit 11.

In accordance with what has been described above, the functional units 12 to 15 of the BOST chip 10 are used for receiving signal conditions, input by the external test device 30, through the signal channels D1–D4 for generating test signals (step 48) that are transmitted to the DUT 20 (step 50) through the interface unit 15 and the test signal channel D10, and for receiving the response signals then generated by the DUT 20 (step 52). The response signals can be checked directly in the BOST chip 10, for example, for their timing and pattern accuracy and with respect to their voltage levels. Step 54.

The switching between the two operating modes (1) and (2) (step 46) that is carried out by the switching/detection unit 11/11a can be carried out in accordance with the following possibilities:

(a) operating mode (1) is stopped while the programmable registers of the register unit 12 in the BOST chip are programmed by the test device 30, i.e., the test of the DUT 20 is interrupted;

(b) the test of the DUT 20 is not interrupted during the programming of the programmable registers of the register unit 12 of the BOST chip due to the fact that registers are programmed within periods in which the BOST chip is not accessing any register values for its algorithmic/logic operations. For such a purpose, however, information about when the BOST chip is not accessing register values must be provided for the external programming from the test device 30. To avoid the need of another control signal between the BOST chip and the test device 30 for such a purpose, the timing synchronization can be achieved by the time that is needed for the timing synchronization having been calculated externally once when the operations of the BOST chip 10 are known in the external test device 30; and (c) testing of the DUT, e.g., of a DRAM, is not interrupted during the programming of the registers in the register unit 12 of the BOST chip 10 due to the fact that programmable registers are duplicated in the BOST and the algorithmic/logic operations of the BOST chip only access the register or registers of the register unit 12 that is/are currently not being programmed.

Naturally, the above description and the diagrammatic representation of the BOST chip 10 in the figure are only examples and are restricted to the functions necessary for explaining the concept according to the invention.

The external drive that, in the above example, is carried out by a conventional test device 30, can also be carried out by a device or system specially configured for carrying out the functions within the scope of the invention.

An essential aspect of a test system according to the invention that uses a BOST chip 10 connected between a test device 30 and a semiconductor circuit or DUT 20 to be tested, thus, is made with the BOST chip, apart from the operating mode in which it tests the semiconductor chip or memory chip 20, having another operating mode in which the programmable registers of the register unit 12 of the BOST chip are programmed and where it is possible to switch to and fro between these two operating modes by external stimuli. The switching between the two operating modes can be carried out by the various possible combinations (a), (b), and (c) described above.

We claim:

1. A system for testing a fast synchronous digital circuit with an external test device outputting signal conditions on a signal path, comprising:

a semiconductor chip for transmitting test signals, including at least one of test data, control, address, and clock signals, to a circuit to be tested, the test system evaluating response signals generated by the circuit to be tested based upon the test signals, said semiconductor chip being implemented as a single chip separate from said test device and said circuit to be tested and inserted into a signal path between the test device and the circuit to be tested, said semiconductor chip having:

means to be connected to the test device for receiving signal conditions input by the test device, said receiving means having a register unit with programmable registers for storing constants and variables for generating the test signals and for evaluating the constants and the variables;

means for generating the test signals for the circuit to be tested, said generating means connected to said receiving means;

means for sending the test signals to the circuit to be tested and for receiving the response signals generated by the circuit to be tested, said sending means connected to said generating means;

means for switching said semiconductor chip between two operating modes as a function of switching criteria, said two operating modes including:

(1) a normal operating mode in which said semiconductor chip drives the circuit to be tested; and (2) a register programming mode in which the registers of the register unit are programmed; and said switching means connected to the test device, to said receiving means, and to said generating means, said switching means being programmed to switch said semiconductor chip into said programming mode only within certain periods when said semiconductor chip is not accessing any of said registers of said register unit for generating test signals, and the test device being adapted to calculate said certain periods for switching said switching means to said programming mode, once, and to store said certain periods in storage means of said test device.

2. The test system according to claim 1, wherein:
the external test device has a separate signal line for transmitting an external switching signal for switching between said two operating modes; and
said switching means is to be connected to the separate signal line for being switched between said two operating modes.

3. The test system according to claim 1, wherein said switching means has a detection means for detecting switching conditions for said two operating modes in dependence on a particular signal sequence in signals transmitted to said semiconductor chip by the test device.

4. The test system according to claim 1, wherein said switching means is programmed to interrupt and to stop said normal operating mode of said semiconductor chip during programming of said registers of said register unit.

5. A system for testing a fast synchronous digital circuit with an external test device outputting signal conditions on a signal path, comprising:
a semiconductor chip for transmitting test signals, including at least one of test data, control, address, and clock signals, to a circuit to be tested, the test system evaluating response signals generated by the circuit to be tested based upon the test signals, said semiconductor chip being implemented as a single chip separate from said test device and said circuit to be tested and inserted into a signal path between the test device and the circuit to be tested, said semiconductor chip having:
    means to be connected to the test device for receiving signal conditions input by the test device, said receiving means having a register unit with programmable registers for storing constants and variables for generating the test signals and for evaluating the constants and the variables;
    means for generating the test signals for the circuit to be tested, said generating means connected to said receiving means;
    means for sending the test signals to the circuit to be tested and for receiving the response signals generated by the circuit to be tested, said sending means connected to said generating means;
    means for switching said semiconductor chip between two operating modes as a function of switching criteria, said two operating modes including:
        (1) a normal operating mode in which said semiconductor chip drives the circuit to be tested; and
        (2) a register programming mode in which the registers of the register unit are programmed; and
said switching means connected to the test device, to said receiving means, and to said generating means;
said semiconductor chip having additional registers equal in number to said registers; and
said semiconductor chip for generating test signals in said normal mode only accessing registers and additional registers that are not currently being programmed.

6. The test system according to claim 5, wherein:
the external test device has a separate signal line for transmitting an external switching signal for switching between said two operating modes; and
said switching means is to be connected to the separate signal line for being switched between said two operating modes.

7. The test system according to claim 5, wherein said switching means has a detection means for detecting switching conditions for said two operating modes in dependence on a particular signal sequence in signals transmitted to said semiconductor chip by the test device.

8. The test system according to claim 5, wherein said switching means is programmed to interrupt and to stop said normal operating mode of said semiconductor chip during programming of said registers of said register unit.

9. A method for testing fast synchronous digital circuits, which comprises:
providing an external test device and a single semiconductor chip separate from the test device and the circuit to be tested and inserting said semiconductor chip into a signal path between the test device and the circuit to be tested;
outputting signal conditions with an external test device to a semiconductor chip;
receiving the signal conditions with the semiconductor chip from the test device;
storing constants and variables for generating test signals in programmable registers of a register unit in the semiconductor chip and evaluating the constants and the variables with the registers of the register unit;
generating test signals with the semiconductor chip and transmitting the test signals including at least one of test data, control, address, and clock signals, with the semiconductor chip to a circuit to be tested based on the signal conditions supplied by the test device;
evaluating the test signals in dependence on response signals generated by the circuit to be tested based upon the test signals supplied thereto;
receiving the response signals with the semiconductor chip; and
switching, as a function of switching criteria, the semiconductor chip between:
    a normal operating mode in which the semiconductor chip drives the circuit to be tested DUT; and
    a register programming mode in which the registers of the register unit are programmed, the semiconductor chip being switched into the register programming mode only within certain periods during which the semiconductor chip is not accessing any of the programmable registers of the register unit and generating test signals, said test device calculating once the certain time periods intended for switching to the programming mode and storing the certain periods within the test device.

10. The test method according to claim 9, which further comprises:
transmitting an external switching signal through a separate signal line of the test device to a switch of the semiconductor chip; and
switching between the normal operating mode and the register programming mode based on the external switching signal.

11. The test method according to claim 9, which further comprises detecting switching conditions for the normal operating mode and the register programming mode in dependence on a particular signal sequence in signals transmitted to the semiconductor chip from the external test device.

12. The test method according to claim 9, which further comprises one of interrupting and stopping the normal operating mode of the semiconductor chip during programming of the registers of the register unit.

13. A method for testing fast synchronous digital circuits, which comprises:
  providing an external test device and a single semiconductor chip separate from the test device and the circuit to be tested and inserting said semiconductor chip into a signal path between the test device and the circuit to be tested;
  outputting signal conditions with an external test device to a semiconductor chip;
  receiving the signal conditions with the semiconductor chip from the test device;
  storing constants and variables for generating test signals in programmable registers of a register unit in the semiconductor chip and evaluating the constants and the variables with the registers of the register unit;
  generating test signals with the semiconductor chip and transmitting the test signals including at least one of test data, control, address, and clock signals, with the semiconductor chip to a circuit to be tested based on the signal conditions supplied by the test device;
  evaluating the test signals in dependence on response signals generated by the circuit to be tested based upon the test signals supplied thereto;
  receiving the response signals with the semiconductor chip; and
  switching, as a function of switching criteria, the semiconductor chip between:
    a normal operating mode in which the semiconductor chip drives the circuit to be tested DUT; and
    a register programming mode in which the registers of the register unit are programmed, said register programming mode:
      duplicating the registers of the register unit; and
      only accessing currently not programmed registers with the semiconductor chip used for generating test signals in the normal operating mode.

14. The test method according to claim 13, which further comprises:
  transmitting an external switching signal through a separate signal line of the test device to a switch of the semiconductor chip; and
  switching between the normal operating mode and the register programming mode based on the external switching signal.

15. The test method according to claim 13, which further comprises detecting switching conditions for the normal operating mode and the register programming mode in dependence on a particular signal sequence in signals transmitted to the semiconductor chip from the external test device.

16. The test method according to claim 13, which further comprises one of interrupting or stopping the normal operating mode of the semiconductor chip during programming of the registers of the register unit.

* * * * *